(12) United States Patent
Mirkin et al.

(10) Patent No.: US 7,273,636 B2
(45) Date of Patent: Sep. 25, 2007

(54) PATTERNING OF SOLID STATE FEATURES BY DIRECT WRITE NANOLITHOGRAPHIC PRINTING

(75) Inventors: Chad A. Mirkin, Wilmette, IL (US); Vinayak P. Dravid, Glenview, IL (US); Ming Su, Evanston, IL (US); Xiaogang Liu, Evanston, IL (US)

(73) Assignee: Northwestern University, Evanston, IL (US)

( * ) Notice: Subject to any disclaimer, the term of this patent is extended or adjusted under 35 U.S.C. 154(b) by 737 days.

(21) Appl. No.: 10/320,721

(22) Filed: Dec. 17, 2002

(65) Prior Publication Data
US 2003/0162004 A1 Aug. 28, 2003

Related U.S. Application Data

(60) Provisional application No. 60/341,614, filed on Dec. 17, 2001.

(51) Int. Cl.
*B05D 5/00* (2006.01)
*B05D 3/02* (2006.01)

(52) U.S. Cl. ............ 427/256; 427/226; 427/229; 977/855; 977/857

(58) Field of Classification Search .............. None
See application file for complete search history.

(56) References Cited

U.S. PATENT DOCUMENTS

| | | | |
|---|---|---|---|
| 6,365,266 B1 | 4/2002 | MacDougall et al. | |
| 6,471,761 B2 | 10/2002 | Fan et al. | |
| 2002/0063212 A1 | 5/2002 | Mirkin et al. | |
| 2002/0122873 A1 | 9/2002 | Mirkin et al. | |
| 2002/0187335 A1 | 12/2002 | Kelley et al. | |
| 2003/0021967 A1* | 1/2003 | Sagiv et al. ............... | 428/209 |

OTHER PUBLICATIONS

Antonelli, D. M., et al., "Synthesis of Hexagonally Packed Mesoporous TiO$_2$ by a Modified Sol-Gel Method", Agnew. Chem. Int. Ed. Engl., vol. 34, No. 18, pp. 2014-2017 (1995).
Demers, L., et al., "Combinational Templates Generated by Dip-Pen Nanolithography for the Formation of Two-Dimensional Particle Arrays", Angew. Chem. Int. Ed., vol. 40, No. 16 (2001).
Fan, H., et al., "Rapid prototyping of patterned functional nanostructures", Nature, vol. 405, p. 56 (2000).
Fan, H., et al., "Rapid prototyping of patterned multifunctional nanostructures", Mat. Res. Soc. Symp. Proc., vol. 624, p. 231 (2000).
Fan, H., et al., "Hierarchically structured functional porous silica and composite produced by evaporation-induced self-assembly", Microporous and Mesoporous Materials, vol. 44-45, pp. 625-637 (2001).
Held, R., et al., "Semiconductor quantum point contact fabricated by lithography with an atomic force microscope", Appl. Phys. Lett. vol. 71, No. 18, p. 2689 (1997).
Hong, S., et al., "A Nanoplotter with Both Parallel and Serial Writing Capabilities", Science, vol. 288, p. 1808 (2000).
Hong, S., et al., "Multiple Ink Nanolithography: Toward a Multiple-Pen Nano-Plotter", Science, vol. 286, p. 523 (1999).
Hong, S., et al., "A New Tool for Studying the in Situ Growth Processes for Self-Assembled Monolayers under Ambient Conditions", Langmuir, vol. 15, pp. 7897-7900 (1999).
Ichinose, I., "A Surface Sol-Gel Process to TiO$_2$ and Other Metal Oxide Films with Molecular Precision", Chem. Mater., vol. 9, pp. 1296-1298 (1997).
Ivanisevic, A., et al., "'Dip-Pen' Nanolithography on Semiconductor Surfaces", J. Am. Chem. Soc. vol. 123, pp. 7887-7889 (2001).
Kong, J., et al., "Synthesis of individual single-walled carbon nanotubes on patterned silicon wafers", Nature, vol. 395, p. 878 (1998).
Li, Y., et al., "Electrochemical AFM 'Dip-Pen' Nanolithography", J. Am. Chem. Soc. vol. 123, pp. 2105-2106 (2001).
Lu., Y., et al., "Self-assembly of mesoscopically ordered chromatic polydiacetylene/silica nanocomposites", NATURE, vol. 410, p. 913 (2001).

(Continued)

*Primary Examiner*—William Phillip Fletcher, III
(74) *Attorney, Agent, or Firm*—Foley & Lardner LLP

(57) ABSTRACT

The present invention includes a method of fabricating organic/inorganic composite nanostructures on a substrate comprising depositing a solution having a block copolymer and an inorganic precursor on the substrate using dip pen nanolithography. The process can comprise providing a substrate, providing a nanoscopic tip having an inking composition thereon, wherein the inking composition comprises at least one metal oxide precursor; and transferring the inking composition from the nanoscopic tip to the substrate to form a deposit on the substrate comprising at least one metal oxide precursor, and optionally further comprising the step of converting the metal oxide precursor on the substrate to form the metal oxide. The nanostructures comprises arrays of lines and/or dots having widths/diameters less than 1 micron. The present invention also includes a device comprising an organic/inorganic composite nanoscale region chemically bonded to a substrate, wherein the nanoscale region, wherein the nanoscale region has a nanometer scale dimension other than height.

66 Claims, 3 Drawing Sheets

OTHER PUBLICATIONS

Madou, M. J., "Fundamentals of Microfabrication: the Science of miniaturization", 2d ed., p. 156 (2001).

Madou, M. J., "Fundamentals of Microfabrication: the Science of miniaturization", 2d ed., p. 368 (2001).

Maynor, B.W., et al., "Au 'Ink' for AFM 'Dip-Pen' Nanolithography", *Langmuir*, vol. 17, pp. 2575-2578 (2001).

Paik, J., et al., "Preparation of Mesoporous Oxides For Mems Structures", Mat. Res. Soc. Symp. Proc. vol. 657, p. EE7.3.1 (2001).

Piner, R. D., et al., "'Dip-Pen' Nanolithography", *Science*, vol. 283, p. 661 (1999).

Vioux, A., "Nonhydrolytic Sol-Gel Routes to Oxides", Chem. Mater. vol. 9, pp. 2292-2299 (1997).

Yang., P., et al., "Hierarchically Ordered Oxides", *Science*, vol. 282, p. 2244 (1998).

Yang., P., et al., "Mirrorless Lasing from Mesostructured Waveguides Patterned by Soft Lithography", *Science*, vol. 287, p. 465 (2000).

Yang., P., et al., "Generalized syntheses of large-pore mesoporous metal oxides with semicrystalline frameworks", NATURE, vol. 396, p. 152 (1998).

Benjamin, Yan Li., et al., J. American Chemical Society (2001), "Electrochemical AFM "Dip-Pen" Nanolithography", vol. 123, pp. 2105-2106.

Fan, H., et al., Materials Research Society (2000), "Rapid Prototyping of Patterned Multifunctional Nanostructures", vol. 624, pp. 231-239.

Held, R., et al., American Institute of Physics, Applied Physics Letters (1997), "Semiconductor quantum point contact fabricated by lithography with an atomic force microscope", vol. 71, pp. 2689-2691.

Maynor, B., et al., American Chemical Society (2001), "Au "Ink" for AFM "Dip-Pen" Nanolithography", vol. 17, pp. 2575-2578.

Yang, P., et al., Nature (1998), "Generalized syntheses of large-pore mesoporous metal oxides with semicrystalline frameworks", vol. 396, pp. 152-155.

Paik, J., et al., Materials Research Society (2001), "Preparation of Mesoporous Oxides for Mems Structures", vol. 657, pp. EE7.3.1-EE7.4.1.

Ivanisevic A., et al., J. American Chemical Society (2001), "Dip-Pen" Nanolithography on Semiconductor Surfaces, vol. 123, pp. 7887-7889.

The International Search Report dated Apr. 28, 2004 (9 pgs.).

* cited by examiner

PATTERNING OF SOLID STATE FEATURES BY DIRECT WRITE NANOLITHOGRAPHIC PRINTING

CROSS-REFERENCE TO RELATED PATENT APPLICATIONS

This application claims benefit of provisional application Ser. No. 60/341,614, filed Dec. 17, 2001, the complete disclosure of which is incorporated herein by reference in its entirety.

This invention was made with governmental support under grants Air Force Office of Scientific Research, AFOSR F49620-00-1-0283; and Defense Advanced Research Project Agency, DARPA DAAD 19-00-1-0414. The government has certain rights in the invention.

BACKGROUND OF THE INVENTION

DIP-PEN NANOLITHOGRAPHY™ printing (DPN™ printing) is a high resolution direct patterning technique in which an "ink" is transferred to a substrate using conventional nanoscopic tips including, for example, scanning probe microscopic (SPM) and atomic force microscopic (AFM) tips. See, e.g., U.S. patent application Ser. Nos. 60/115,133, filed Jan. 7, 1999; 60/157,633, filed Oct. 4, 1999; 09/477,997, filed Jan. 5, 2000; 60/207,711, filed May 26, 2000; 60/207,713, filed May 26, 2000; 09/866,533, filed May 24, 2001; and 60/326,767, filed Oct. 2, 2001, and PCT applications numbers PCT/US00/00319, filed Jan. 7, 2000 (publication number WO 00/41213), and PCT/US01/17067, filed May 25, 2001, the complete disclosures of which are incorporated herein by reference.

DIP-PEN NANOLITHOGRAPHY™ printing and DPN™ are trademarks of NanoInk, Inc., Chicago, Ill. DPN-related products including hardware, software, instrumentation, and kits can be obtained from NanoInk.

The development of dip pen nanolithographic printing is described in patent application 09/866,533, filed May 24, 2001, particularly in the "Background of the Invention" section (pages 1-3), which is hereby incorporated by reference in its entirety.

DPN printing can be used for many ink-substrate combinations including, for example, alkylthiol and arylthiol self-assembly on gold (reference 1) and has also been extended to silazanes on semiconductor surfaces (reference 3) and metal structures on conductive surfaces (reference 4). In addition, it has been used extensively as a way of making patterns out of simple organic and complex biological molecules, including thiol-functionalized proteins and alkylthiol-modified oligonucleotides, which can be used to direct the assembly of higher-ordered architectures (reference 5).

Solid state microscale structures are important to industry including the electronics and optical communications industries. To increase the speed and device density of integrated circuits, it is important to make structures even smaller than currently possible. It is an important commercial goal of nanotechnology to manufacture solid state structures on a nanoscale.

A variety of patterning techniques have been used in attempts to fabricate nanoscale structures including photolithography, X-ray lithography, and electron beam lithography. However, attempted miniaturization in making electronic and optical devices can generate significant problems. For example, failure to provide adequate separation between electrical current carrying features may lead to short circuiting. Additionally, both optical and electrical features must be well defined and be dimensionally accurate to ensure that the devices operate as designed.

The prior art lithographic methods for making nanoscale solid state features are generally limited to scales larger than nanoscopic. Therefore, it would be advantageous to have a process which has the nanoscale precision and capability of DPN printing and the ability to form glass and ceramic structures. Preferably, the process should include a suitable reactive process such as, for example, sol-gel processes. Sol-gel chemistry is a useful industrial method for making inorganic components including the formation of metal oxides from metal oxide precursors.

SUMMARY OF THE INVENTION

In this section, the invention is summarized, although this summary should not limit the invention which is described in detail and claimed below.

In one embodiment, the present invention provides a method of nanolithography comprising: providing a substrate, providing a nanoscopic tip having an inking composition thereon, wherein the inking composition comprises at least one metal oxide precursor; transferring the inking composition from the nanoscopic tip to the substrate to form a deposit on the substrate comprising at least one metal oxide precursor.

In addition, the present invention also provides a method of nanolithography comprising: positioning a scanning probe microscopic tip having a reactive ink composition thereon relative to a substrate so that the reactive ink composition is transferred from the nanoscopic tip to the substrate to form a deposit on the substrate, wherein the reactive ink is a sol-gel precursor capable of undergoing a sol-gel reaction.

In another embodiment, the invention provides a method of nanolithography comprising patterning a nanoscopic deposit comprising a solid state material precursor on a substrate, and converting the solid state material precursor to the solid state material.

Still further, the invention provides in another embodiment a method of fabricating inorganic/organic nanostructures comprising depositing an ink on a substrate by direct write nanolithography to form a deposit, wherein the ink comprises an inorganic precursor and at least one organic polymer.

The invention also includes nanoscopically patterned substrates comprising on the substrate surface at least one deposit prepared by the methods described herein.

The invention, in addition, also provides a device comprising: a substrate, at least one nanostructure on the substrate prepared by direct write nanolithography, the nanostructure having at least one lateral dimension of about 1,000 nm or less and comprising metal oxide precursor or metal oxide.

The invention also provides a device comprising: a substrate, at least one nanoscale feature on the substrate prepared by direct-write nanolithography, the nanoscale feature having at least one lateral dimension of about 1,000 nm or less and comprising a sol-gel material.

The invention also provides a nanoarray comprising a plurality of nanostructures on a substrate prepared by direct-write nanolithography, the nanostructures having at least one lateral dimension of about 1,000 nm or less and comprising at least one metal oxide precursor or one metal oxide.

Basic and novel features of the invention are set forth below and include, for example, direct write capability, serial patterning with ultrahigh resolution, molecular generality and use of wide variety of functional groups and materials, relatively low cost, ease of use, non-planar substrates, and unparalleled registration. The invention, briefly, opens up the opportunity for using DPN printing to deposit solid-state materials rather than organic molecules onto surfaces with the resolution of an AFM without the need for a driving force other than chemisorption such as, for example, applied fields. The invention can be used in areas ranging from mask fabrication to the evaluation of solid-state nanoelectronic structures and devices fabricated by DPN printing. Because the diffusion coefficients of sol inks are qualitatively comparable to that of alkanethiols on gold, relatively fast patterning by DPN printing can be carried out. The composite nanostructures described herein can have large surface areas that are important for catalyst and waveguide applications. Use of complicated and expensive resists, photomasks, and molds are not needed.

DETAILED DESCRIPTION OF THE INVENTION

Figure 1:
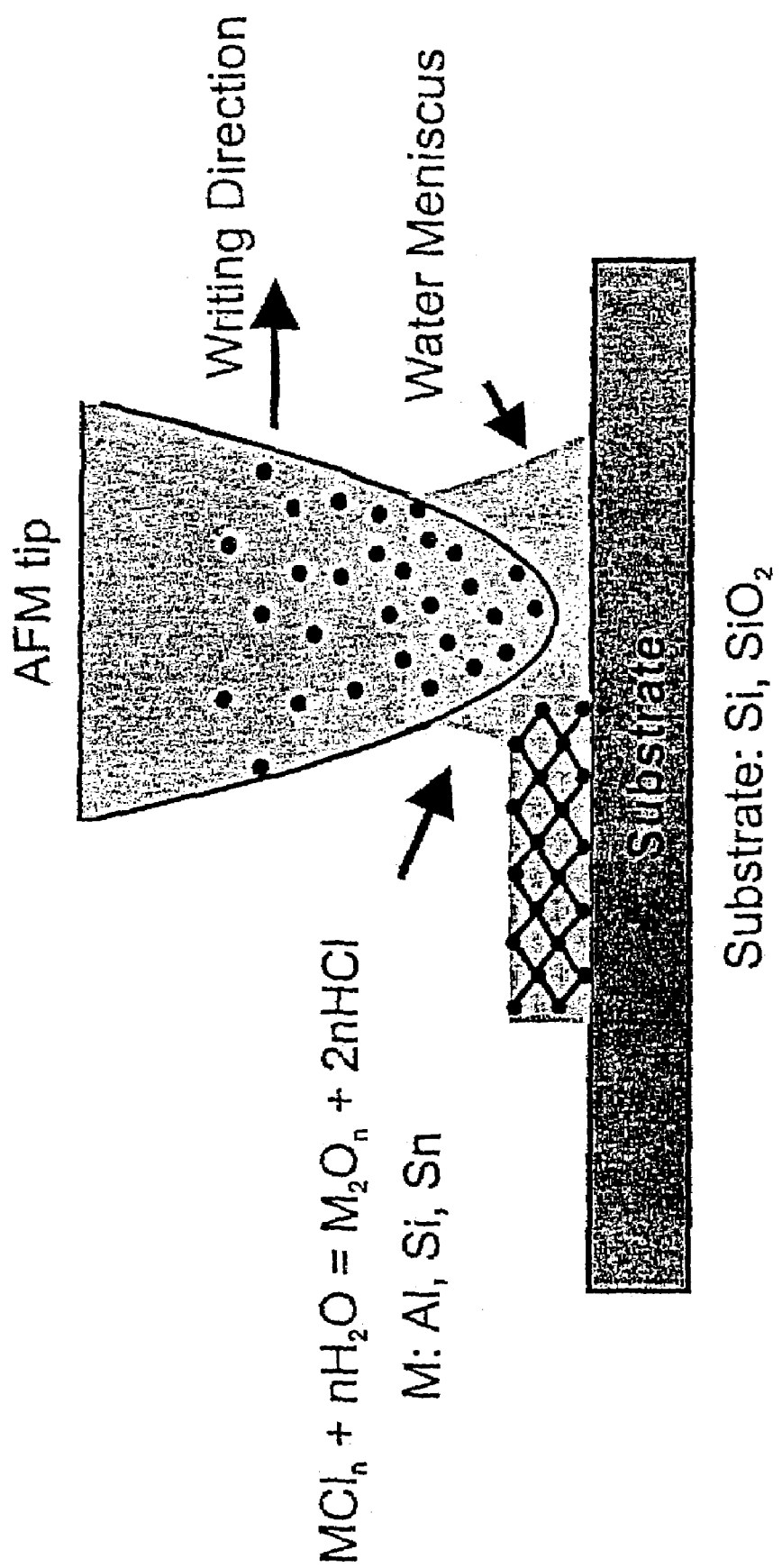
FIG. 1. Schematic diagram illustrating deposition of metal oxide precursors and metal oxides on a substrate surface from an AFM tip.
Figure 2A:
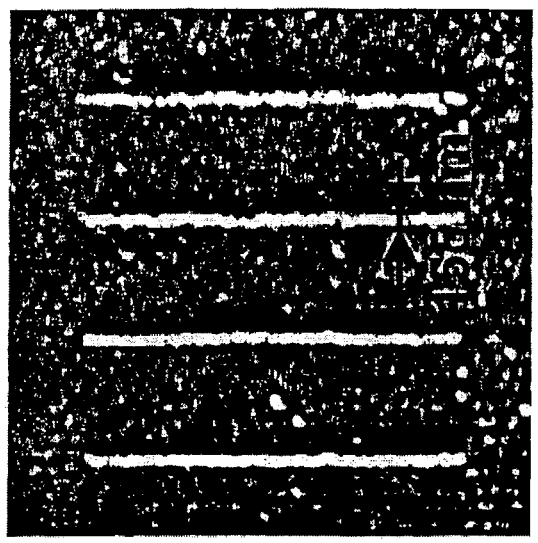
FIG. 2. (A) Topographic AFM image of composite tin oxide/P-123 nanostructures on silicon oxide; the writing speed for each line is 0.2 µm/sec. (B) Lateral force microscope (LFM) image of a dot array of aluminum oxide/P-123 composite nanostructures formed on silicon; the holding time for each dot is 1 second. AFM images collected before (C) and after (D) heating silicon oxide/P-123 composite nanostructures in air at 400° C. for 2 hours; the writing speed is 0.1 µm/sec. Note the lateral dimensions are enlarged due to tip convolution.
Figure 2B:
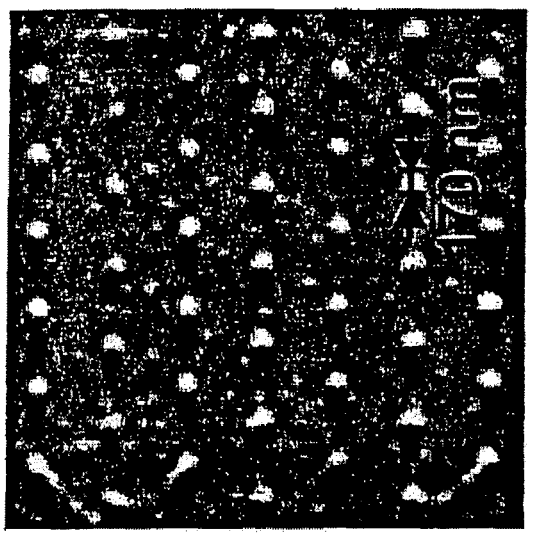
Figure 2C:
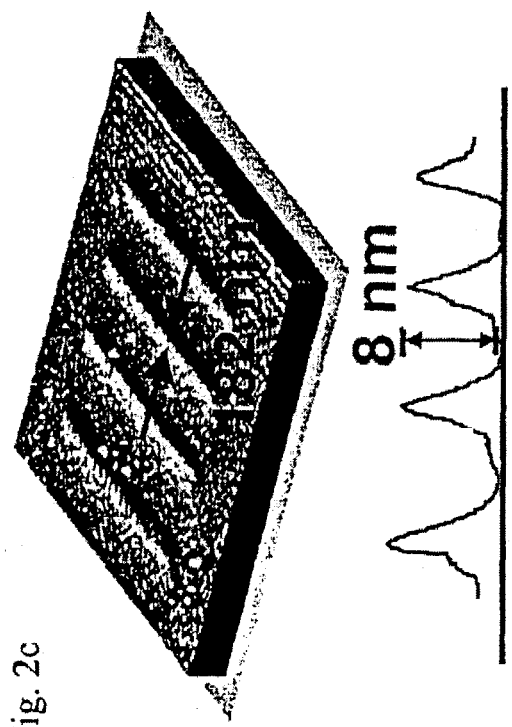
Figure 2D:
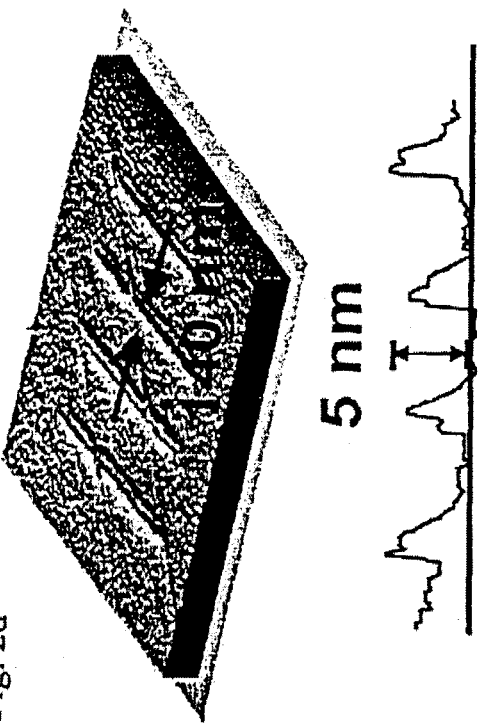

Nanolithography, including DPN printing, can be used to practice the present invention. For example, in patent application Ser. No. 09/866,533, filed May 24, 2001, (U.S. patent publication no. US 2002/0063212 A1 published May 30, 2002 to Mirkin et al.) DPN printing background and procedures are described in detail covering a wide variety of embodiments including, for example:
  background (pages 1-3);
  summary (pages 3-4);
  brief description of drawings (pages 4-10);
  use of scanning probe microscope tips (pages 10-12);
  substrates (pages 12-13);
  patterning compounds (pages 13-17);
  practicing methods including, for example, coating tips (pages 18-20);
  instrumentation including nanoplotters (pages 20-24);
  use of multiple layers and related printing and lithographic methods (pages 24-26);
  resolution (pages 26-27);
  arrays and combinatorial arrays (pages 27-30);
  software and calibration (pages 30-35; 68-70);
  kits and other articles including tips coated with hydrophobic compounds (pages 35-37);
  working examples (pages 38-67);
  corresponding claims and abstract (pages 71-82); and
  FIGS. 1-28.

All of the above document text, including each of the various subsections enumerated above including the figures, is hereby incorporated by reference in its entirety and form part of the present disclosure, supporting the claims.

Additional nanolithographic methods, including dip pen and aperture pen nanolithography, are also disclosed in U.S. Patent Publication No. 20020122873 A1 published Sep. 5, 2002 to Mirkin et al., which is also hereby incorporated by reference in its entirety and form part of the present disclosure, supporting the claims.

In addition, the development of patterning of solid state structures is described, with literature citations, in priority application Ser. No. 60/341,614, filed Dec. 17, 2001, including the use of dip pen nanolithographic printing to generate organic/inorganic solid state structures, which is hereby incorporated by reference in its entirety.

Sol-gel chemistry can be used to practice the present invention. For example, nanostructures and nanoarrays can be prepared using the technologies of sol-gel chemistry and DPN printing in combination. For the present invention, the sol-gel process generally refers to a low temperature method using chemical precursors that can produce ceramics and glasses with better purity and homogeneity than high temperature conventional processes. This process can be used to produce a wide range of compositions (for example metal oxides) in various forms, including compositions useful for powders, fibers, coatings/thin films, monoliths, composites, and porous membranes. In the present invention, organic/inorganic hybrids, where an inorganic gel is impregnated with organic components such as polymers or organic dyes to provide specific properties, can also be made. An attractive feature of the sol-gel process is the capability to produce compositions not possible with conventional methods. Another benefit is that the mixing level of the solution is retained in the final product, often on the molecular scale. For example, nanocomposites can be made. Applications for sol-gel derived products, including those of the present invention, are numerous. Applications include coatings and thin films used in electronic, optical and electro-optical components and devices, including optical absorption or index-graded antireflective coatings. Other example devices include capacitors, memory devices, substrates and infrared (IR) detectors. Additional devices include thin film transistors, field effect transistors, bipolar junction transistors, hybrid transistors, charge transfer devices, field emission devices, integrated circuits, solar cells, light emitting diodes, flat panel displays, optical waveguides, and waveguide division multiplexers. Antireflection coatings are also used for automotive and architectural applications. Protective and decorative coatings can also be made. Additional uses include dental and biomedical applications as well as agrochemicals and herbicides. Glass monoliths/coatings and inorganic/organic hybrids are under development for lenses, mirror substrates, graded-index optics, optical filters, chemical sensors, passive and nonlinear active waveguides, lasers, and high resolution masks. Membranes for separation and filtration processes also are being investigated, as well as catalysts. More recently, biotechnology applications have been developed, where biomolecules are incorporated into sol-gel matrices. Applications include biochemical processes monitoring, environmental testing, food processing, and drug delivery for medicine or agriculture.

For purposes of the present invention, the sol-gel process can be carried out in liquid solution of organometallic precursors, which, by means of hydrolysis and condensation reactions, lead to the formation of a new phase (sol).

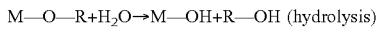
M—O—R+H₂O→M—OH+R—OH (hydrolysis)

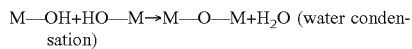
M—OH+HO—M→M—O—M+H₂O (water condensation)

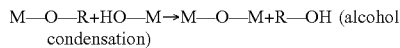
M—O—R+HO—M→M—O—M+R—OH (alcohol condensation)

The sol can be made of solid particles suspended in a liquid phase. Then the particles can condense in a new phase (gel) in which a solid macromolecule is immersed in a liquid phase (solvent). This is a gelatinous network. Drying the gel by means of low temperature treatments (typically, for example, about 25° C. to about 400° C., and more typically about 25° C. to about 100° C.), results in porous solid matrices (xerogels) which if desired can be calcined into a dense ceramic. With use of rapid drying, aerogels can be made. An important property of the sol-gel process is that it is possible to generate glass or ceramic material at a temperature close to room temperature.

In addition, sol-gel chemistry can be used to make mesoporous structures from inorganic salts and polymer surfactants (see, for example, reference 6). In the present invention, for example, sol-gel reactions can be used to convert an inking composition comprising at least one metal oxide precursor to the corresponding metal oxide as inking composition is placed on the tip, transferred from the tip to the substrate to form a deposit, and subsequently processed. In a preferred embodiment, arrays, microarrays, and nanoarrays can be prepared.

Use of sol-gel chemistry in nanotechnology is disclosed in, for example, *Fundamentals of Microfabrication, The Science of Miniaturization*, 2$^{nd}$ Ed., (2002), Marc J. Madou, CRC Press, including for example, pages 156-157 and 368-369, which is hereby incorporated by reference.

Arrays, microarrays, and nanoarrays are known in the art. DPN printing, particularly parallel DPN printing, is also especially useful for the preparation of arrays, and grids. An array is an arrangement of a plurality of discrete sample areas, or pattern units, forming a larger pattern on a substrate. The number in this plurality is not particularly limited but can be, for example, at least about 10, at least about 100, at least about 1,000, and at least about 10,000. It can be, in some cases, over 1,000,000. The sample areas, or patterns, may be any shape (e.g., dots, lines, circles, squares or triangles) and may be arranged in any larger pattern (e.g., rows and columns, lattices, grids, etc. of discrete sample areas). Each sample area may contain the same or a different sample as contained in the other sample areas of the array.

DPN printing, particularly parallel DPN printing, is particularly useful for the preparation of nanoarrays and grids on the submicrometer scale. An array on the submicrometer scale means that at least one of the dimensions (e.g, length, width or diameter) of the sample areas, excluding the depth or height, is less than 1 μm. In other words, at least one lateral dimension of the deposit is about 1,000 nm or less. The lateral dimension can be, for example, about 500 nm or less, or in other embodiments, about 200 nm or less. Arrays on a submicrometer scale allow for denser packing of devices. This typically results in faster overall devices. The deposit can have a depth, or height, of about 50 nm or less, or more particularly, about 8 nm or less.

DPN printing, for example, can be used to prepare nanoarray dots that are approximately 1 micron in diameter or less, approximately 500 nanometers in diameter or less, approximately 200 nanometers in diameter or less, approximately 100 nanometers in diameter or less, approximately 50 nanometers in diameter or less, or approximately 10 nanometers in diameter or less. With sharp tips, dots can be produced about 1 nm in diameter.

DPN printing, for example, also can be used to prepare nanoarray lines having widths that are approximately 1 micron or less, approximately 500 nanometers or less, approximately 200 nanometers or less, approximately 100 nanometers or less, approximately 50 nanometers or less, or approximately 10 nanometers or less. With sharp tips, lines can be produced about 1 nm in width.

The nanoarray can comprise nanostructures which are separated by a distance of about 1,000 nm or less, and more particularly, about 500 nm or less, and more particularly, about 200 nm or less. Separation distance can be measured by method known in the art including AFM imaging.

DPN printing processes can involve depositing molecules which do not generally undergo chemical reaction in solution during printing. That is, the processes can concentrate on physical, non-reactive transportation of the patterning or ink molecule from the tip to the substrate followed by chemisorption or covalent bonding to the substrate. This process works well for the deposition and fabrication of organic layers. The deposition and fabrication of layers comprising inorganic components, especially ceramic and glass layers, can be effectively accomplished through a reactive process, including for example, a sol-gel reactive process. In other words, it can be a reactive DPN printing process. Here, some of the constituents in the solution undergo chemical reaction in the solution to form the deposition material.

In particular, DPN printing, and the aforementioned procedures, instrumentation, and working examples, surprisingly can be adapted also to fabricate solid state structures, especially those comprising inorganic, metal oxide, and sol-gel materials as described further herein. An embodiment is illustrated in FIG. 1, which illustrates a nanoscopic AFM tip and a water meniscus. In many cases, although the role of the meniscus is not entirely clear and the present invention is not limited by theory, the inking composition is transported from the tip to the substrate surface via a water meniscus formed between the tip and substrate surface under ambient conditions or conditions of relatively high humidity such as, for example, more than about 40% (see, for example, reference 2).

The type of nanoscopic tip and the type of substrate are not particularly limited and the invention has broad applicability. For example, the tip can be hollow or non-hollow. The substrate can be primed with a primer layer or unprimed. If a primer is used, multiple priming layers can be used. The substrate can be an electrical insulator, an electrical semiconductor, or an electrical conductor. Significantly, the methods described herein do not require conducting substrates which makes the method more versatile. Typical substrates include, but are not limited to, silicon, $SiO_2$, germanium, SiGe, GaAs, InP, AlGaAs, AlGaP, AlGaInP, and GaP. The substrate can be primed, if desired, with a relatively thin priming layer including, for example, a monolayer or self-assembled monolayer. Multiple priming layers can be used including two, three, four, or more layers.

Herein, new DPN printing-based methods for the direct patterning of organic/inorganic composite nanostructures on substrates such as, for example, silicon and oxidized silicon substrates are disclosed. In a preferred embodiment, hydrolysis of metal precursors, including metal oxide precursors, can be used. The actual hydrolysis reaction depends on the precursor and the hydrolysis product. A typical hydrolysis reaction is described by the following equation: $2MCl_n + nH_2O \rightarrow M_2O_n + 2nHCl$; where M is a metal. The hydrolysis reaction may occur either in the "ink well" prior to dipping the deposition tool (typically a nanoscopic tip such as an SPM or AFM tip) and/or in the meniscus between the nanoscopic deposition tool tip and the substrate surface.

The inks used in the present invention can be hybrid composite solutions comprising, for example, inorganic salts (the metal precursors) and surfactants such as, for example, amphiphilic block copolymer surfactants. The metal precursor is typically a metal halide, more typically a metal chloride. However, many other metal precursors may be used and are known to those of ordinary skill in the art. Exemplary metals include Al, Si, Sn, Ti, Zr, Nb, Ta, W, In and Hf.

Surfactants can be used if desired. They can be ionic or nonionic, cationic or anionic. They can be polymeric or copolymeric. They can be amphilic, comprising a hydrophilic and a hydrophobic component. The hydrophilic and hydrophobic components of the surfactant can be adjusted to provide the desired DPN printing method and structure. The copolymer surfactant, if used, can perform a number of functions. For example, it can disperse and stabilize the inorganic ink precursor, increase ink fluidity, and act as a structure-directing agent for the materials that comprise the patterned nanostructures (e.g., generate mesoporosity). Particularly effective examples include block copolymer surfactants such as copolymers of poly(alkylene oxides) including copolymeric poly(ethylene oxides) and poly(propylene oxides). Of the poly(alkylene oxides), poly (ethyleneoxide)-b-poly (propyleneoxide)-b-poly (ethyleneoxide), ($EO_{20}PO_{70}EO_{20}$) (Pluronic P-123, BASF) has been found to be particularly effective.

One type of product of reactive DPN printing can be an oxides and metal oxides. Typical oxides include, but are not limited to, $Al_2O_3$, $SiO_2$, $SnO_2$, $TiO_2$, $ZrO_2$, $Nb_2O_5$, $Ta_2O_5$, $WO_3$, $HfO_2$, $In_2O_3$. In addition, according to one embodiment of the invention, it is also possible form mixed oxides. These include, for example, $SiAlO_{3.5}$, $SiTiO_4$, $ZrTiO_4$, $Al_2TiO_5$, $ZrWO_8$ and indium tin oxide (ITO).

The process of using reactive dip pen nanolithographic printing can be similar to other nanolithographic printing processes. For example, first, the ink or inking composition can be made. In one embodiment of the invention, the ink can be made by mixing a metal oxide precursor and an amphiphilic block copolymer surfactant and allowing them to form a sol. Then, as in other DPN printing processes, a nanoscopic tip such as an AFM tip is dipped into the ink, picking up a small amount of sol. The nanoscopic tip such as an AFM tip is then brought to the surface of the substrate and the sol deposited. If desired, the nanoscopic tip can be modified to improve the ability of the inking composition to coat the tip and be transferred therefrom to the substrate.

In a second embodiment of the invention, the sol is not formed in the ink well. As in the first embodiment, the first step is to mix a metal precursor and an amphiphilic block copolymer surfactant. However, in this embodiment, a nanoscopic tip such as the AFM tip is dipped into the ink before the sol forms. In this embodiment, the sol is formed on the nanoscopic tip.

Preferably, during deposition and transfer of the ink to the substrate, the relative humidity is in the range of approximately 25% to approximately 95% and in a temperature range of approximately 15° C. and approximately 45° C. A particularly useful combination is a relative humidity of approximately 30% to approximately 50% and a temperature of 20° C. Typically, depositing is done by scanning an AFM tip across the substrate at a rate between approximately 0.1 µm/sec and approximately 0.4 µm/sec. One particularly useful rate is 0.2 µm/sec.

During inking, transfer, and deposition, the ink can comprise mesophases. The surfactant molecules or block copolymers can form micelles or liquid crystalline phases in the solvent such as water. These liquid crystalline phases include lamellar, hexagonal, cubic structures. The length scale of these structures can be, for example, about 1 nm to about 50 nm. Evaporation-induced self-assembly can be used, which can be a spontaneous organization of materials through non-covalent interactions induced by evaporation.

The substrate can be heated at relatively low temperatures after deposition to remove the organic moiety. The time and temperature of post-deposition heat treatment is not particularly limited. For example, temperature of up to about 900° C. can be used. The post deposition heat treatment can be typically between 25° C. and 500° C., preferably between 300° C. and 500° C. The post deposition heat treatment is typically between 0.5 and 4 hours. A particularly useful combination is approximately 400° C. for 2 hours. Heating can be controlled to control shrinkage.

If an organic moiety is used in the ink, the organic can be removed with heating. After removing the organic moiety, the result can be, for example, a porous, microporous, or mesoporous metal oxide. Pore sizes can be, for example, about 1 nm to about 50 nm.

DPN printing can be used to generate one molecule thick structures through the controlled movement of an ink-coated AFM tip on a desired substrate (see, for example, reference 1). Significantly, reactive DPN printing allows one to prepare solid-state structures with controlled geometry at the individual molecule level. With the use of reactive DPN printing, arrays of dots and lines can be written easily with control over feature size and shape on the sub-200 nm level. Further, functional materials can be added into sol inks (see, for example, reference 9). For example in the case of catalysts, these types of structures could be very important for initiating the growth of larger structures (e.g. nanotubes) from a surface patterned with these materials.

The sol patterning process complements the larger scale micromolding techniques (see, for example, reference 10) by offering substantially higher resolution and the ability to make multicomponent nanostructures with ultrahigh registry (see, for example, reference 1b).

Four particularly preferred methods can be used in the present invention.

In a first preferred embodiment, the present invention provides a method of nanolithography comprising: providing a substrate, providing a nanoscopic tip having an inking composition thereon, wherein the inking composition comprises at least one metal oxide precursor; transferring the inking composition from the nanoscopic tip to the substrate to form a deposit on the substrate comprising at least one metal oxide precursor. The method can further comprise the step of inking the nanoscopic tip with the inking composition prior to the transferring step to provide the nanoscopic tip having inking composition thereon. Inking the nanoscopic tip with inking composition can comprise forming the inking composition and transferring the inking composition to the end of the nanoscopic tip. The method can further comprise the step of converting the metal oxide precursor on the substrate to form the metal oxide by, for example, heating. The nanoscopic tip can be a scanning probe microscopic tip, including both hollow and non-hollow tips, and preferably an atomic force microscopic tip. The deposit can have at least one lateral dimension which is about 1,000 nm or less, preferably about 200 nm or less. The deposit can have a height of about 50 nm or less, more particularly, about 8 nm or less. The substrate can be silicon or silicon oxide.

In addition, the present invention also provides a second preferred embodiment: a method of nanolithography comprising positioning a scanning probe microscopic tip having a reactive ink composition thereon relative to a substrate so that the reactive ink composition is transferred from the nanoscopic tip to the substrate to form a deposit on the substrate, wherein the reactive ink is a sol-gel precursor capable of undergoing a sol-gel reaction. The invention can further comprise the step of heating the deposit to substantially complete the sol-gel reaction.

In a third preferred embodiment, the invention provides a method of nanolithography comprising patterning a nanoscopic deposit comprising a solid state material precursor on a substrate, and converting the solid state material precursor to the solid state material. The solid state material can be an oxide, and preferably a metal oxide. The solid state material can be mesoporous.

Still further, the invention provides in a fourth preferred embodiment a method of fabricating inorganic/organic nanostructures comprising depositing an ink on a substrate by direct write nanolithography to form a deposit, wherein the ink comprises an inorganic precursor and at least one organic polymer. The ink can be a sol, and the inorganic precursor can be a metal oxide precursor. Patterns of dots and patterns of lines can be formed.

Technical literature which can be used as a further guide in practicing the present invention, including various combinations of sol-gel technology and nanotechnology, include, for example, U.S. Pat. No. 6,471,761 to Fan et al.; and U.S. Pat. No. 6,365,266 to McDougall et al., each of which are hereby incorporated by reference. For example, U.S. Pat. No. 6,471,761 discloses coating compositions which can be used in the present invention comprising tetraethoxysilane (TEOS), a surfactant, at least one organosilane, HCl, water, and ethanol. A dye component can be used if desired. The coating compositions can be patterned by methods including micropen lithography. In addition, the disclosure found in the article by Fan et al., *Microporous and Mesoporous Materials*, 44-45 (2001) 625-637 can be used to practice the present invention and is hereby incorporated by reference.

In addition, U.S. Patent Publication No. 20020187335 A1 published Dec. 12, 2002 to Kelly et al. also can be used to practice the present invention and is hereby incorporated by reference. This reference discloses metal oxide coatings having nanotextured surfaces defined by a plurality of capillary openings arranged in a pattern on the surface of the coating. Each of the capillary openings have a diameter defined by a previously present organic macromolecule. The diameter can be, for example, less than about 10 nm. The metal oxides can be ceramics characterized by high hardness, wear resistance, corrosion resistance, abrasion resistance, and thermal stability.

In addition, U.S. Pat. No. 6,380,266 to Katz et al. also can be used to practice the invention and is hereby incorporated by reference. This reference discloses amorphous inorganic materials having pores of controlled size and shape with one or more spatially organized functional groups formed therein. The functional groups can be positioned in a defined three dimensional relationship with the voids and with respect to each other. By varying both the positions and identities of these functional groups, diverse sets of substrate specific adsorbents and non-biologically-based catalysts can be made. The organic group can be covalently attached to the inorganic oxide.

Solid state materials, non-molecular solids, and metal oxides which can be used in the present invention are generally discussed in Cotton and Wilkinson, *Advanced Inorganic Chemistry, A Comprehensive Text*, $4^{th}$ Ed., including for example pages 1-27 which is hereby incorporated by reference. This includes substances that exist in the solid state as extended arrays rather than molecular units. These can be called nomnolecular substances or structures.

In addition, the following reference can be used to practice the present invention and is hereby incorporated by reference: Yang, P. et al. *Nature* 1998, 396, 152. This discloses generalized syntheses of large-pore mesoporous metal oxides with semicrystalline frameworks.

In addition, the reference Vioux, A. *Chem. Mater.* 1997, 9, 2292 can be used to practice the present invention and is hereby incorporated by reference. This reference discloses nonhydrolytic sol-gel methods to form oxides including hydroxylation in non-aqueous systems and aprotic condensation reactions.

Further, the reference Antonelli, D. et al. *Angew. Chem. Int. Ed. Engl.* 1995, 34, 2014 can be used to practice the present invention and is hereby incorporated by reference. It discloses, for example, the synthesis of hexagonally packed mesoporous titanium dioxide by a modified sol-gel route.

In addition, the reference Ichinose, I. et. al. *Chem. Mater.* 1997, 9, 1296 can be used to practice the present invention and is hereby incorporated by reference. It discloses, for example, a surface sol-gel process of titanium dioxide and other metal oxide films with molecular precision.

Other references which can be used, include, for example: Yang, P. et al. *Science* 2000, 287, 465; Lu, Y. et al. *Nature* 2001, 410, 913; and Fan, H. et al. *Nature* 2000, 405, 56; and Yang, P. et al. *Science* 1998, 282, 2244, which are hereby incorporated by reference.

The invention is further illustrated with use of the following non-limiting working examples, which do not limit the invention.

WORKING EXAMPLES

Experimental

A ThermoMicroscopes CP AFM and conventional silicon nitride micro-cantilevers (force constant of 0.05 N/m) were used for all patterning experiments. In each experiment, the tip was coated by dipping it into the as-prepared sols at room temperature for 20 seconds. All patterning experiments were conducted under ambient conditions without rigorous control over humidity (~40%) and temperature (~20° C.) with a tip-surface contact force of 0.5 nN. To minimize the piezo tube drift, a 90 µm scanner with closed loop scan control was used for all patterning experiments. Subsequent imaging of the generated patterns was done with the ink-coated tip under conditions identical to those used for patterning but at a higher scan rate (6 Hz).

In a typical experiment, an inorganic precursor solution (sol) was prepared by dissolving 1 g of the block copolymer poly (ethylencoxide)-b-poly (propyleneoxide)-b-poly (ethyleneoxide), ($EO_{20}PO_{70}EO_{20}$) (Pluronic P-123, BASF) in 10 g of ethanol and then adding 0.01 mol of the desired inorganic chloride precursor. The mixture was stirred vigorously for 30 minutes to generate the sol. The as-made sols were transparent fluids. The ethanol slows the hydrolysis of the inorganic precursor (as compared with water) (see references 7), and as a result the gelation normally occurs after several hours and is not complete until several days. This time frame allows one to easily do DPN printing experiments, which for the ones described herein take only a few minutes.

Examples 1 and 2

Dots, lines and complex patterns comprised of tin-oxide and aluminum oxide have been generated on silicon and silicon oxide (>600 nm oxidation layer) substrates, as shown in FIG. 2. For example, 155 nm wide parallel lines made of tin-oxide have been constructed on $SiO_2$ by moving a tip coated with the composite ink ($SnCl_4$ and P-123) across the substrate (0.2 μm/sec). Similarly, dots consisting of $Al_2O_3$ were generated on a Si substrate using a tip coated with ($AlCl_3$ and P-123) by successively bringing the tip in contact with substrate for 1 s/dot intervals. These structures maintain their shapes even after repeated imaging (5 times) and are indefinitely stable (>1 month) under ambient conditions.

Example 3

A Si sol (comprised of $SiCl_4$ and P-123) was patterned onto a silicon oxide substrate in the form of parallel lines. The composition of the lines is expected to be a mixture of $SiO_X$ and the polymer. When heated in air at 400° C. for 2 hour, the copolymer surfactant is expected to combust leaving a $SiO_2$ nanostructure. Consistent with this hypothesis, an AFM image collected from the same area post heating indicated that the pattern height decreases from 8 nm to 5 nm, FIG. 2c and 2d.

Example 4

Figure 3A:
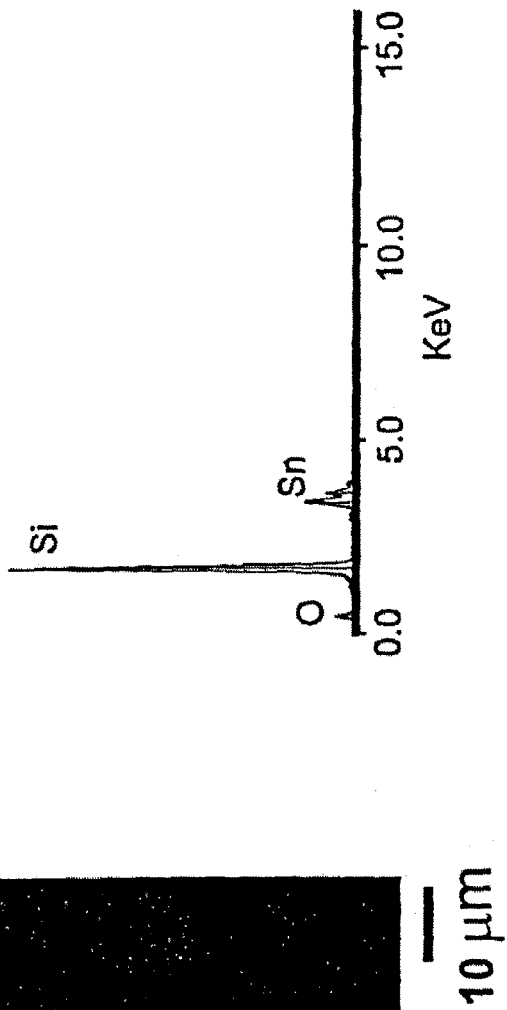
FIG. 3. (A) Scanning Electron Microscope (SEM) image of a 4 µm $SnO_2$ dot formed by holding an ink-coated tip on the substrate for 30 seconds. (B) EDX analysis of the $SnO_2$ dot. (C) EDX of the $SiO_2$ substrate outside of the dot. (D) TEM image of the mesoporous $SiO_2$. The image was collected from heated samples with a Hitachi HF-2000 TEM.
Figure 3B:
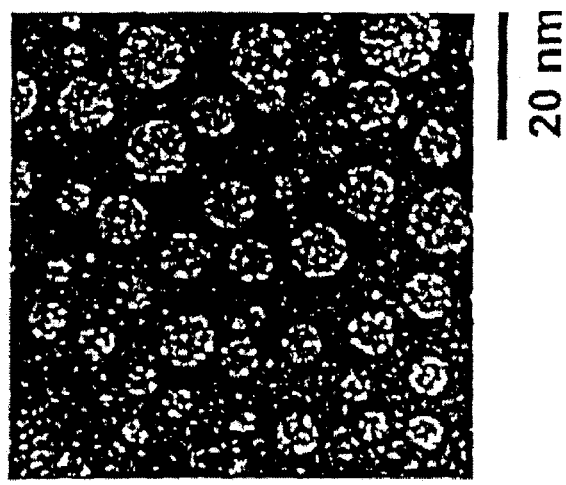
Figure 3C:
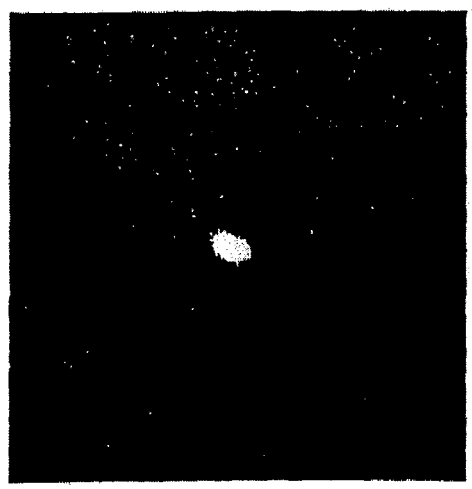
Figure 3D:
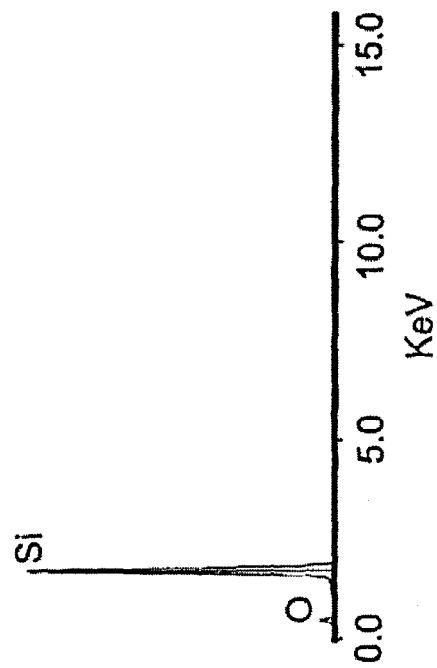

The types of oxide structures that can be formed were not particularly limited subject when sol precursors are generally available. Indeed, tin-oxide structures have been prepared from $SnCl_4$ and P-123 on $SiO_2$, Energy Dispersive X-Ray (EDX) analysis of a 4 μm $SnO_2$ dot formed by holding the ink-coated tip for 30 sec shows the expected peaks for tin, silicon and oxygen, confirming the chemical identity of the microstructure (FIGS. 3a-3c). The copolymer used here is known as a structure-directing agent for mesoscopic ordered solids. Transmission Electron Microscope (TEM) images of bulk as-prepared products (used as a control), after being heated at 400° C. for 2 h, show that the pore size for $SiO_2$ is about 10 nm, FIG. 3d. These structures are believed to be chemisorbed to the underlying substrate. Indeed, others have shown that when sols hydrolyzed on oxide substrates, they form thin films that are adsorbed to the substrates through silicon-oxygen-metal bonding (see reference 8).

Finally, the nanostructures in FIG. 2 can undergo the same structural transition as observed for the bulk material.

The following references are cited above, can be used to practice the present invention, and are hereby incorporated by reference in their entirety.

(1) (a) Piner, R.; Zhu, J.; Xu, F.; Hong, S.; Mirkin, C. A. Science 1999, 283, 661; (b) Hong, S.; Zhu, J.; Mirkin, C. A. Science 1999, 286, 523; (c) Hong, S.; Zhu, J.; Mirkin, C. A. Science 2000, 288, 1808.
(2) Hong, S.; Zhu, J.; Mirkin, C. A. Langmuir 1999, 15, 7897.
(3) Ivanisevic, A.; Mirkin, C. A. J. Am. Chem. Soc. 2001, 123, 7887.
(4) (a) Li, Y.; Maynor, B.; Liu, 1. J. Am. Chem. Soc. 2001, 123, 2105; (b) Maynor, B.; Li, Y.; Liu, J. Langmuir 2001, 17, 2575.
(5) (a) Demers, L. M.; Mirkin, C. A. Angew. Chem. Int. Ed. 2001, 40, 3069; (b) Demers, L. M.; Park, S.-J.; Taton, A.; Li, Z.; Mirkin, C. A. Angew. Chem. Int. Ed. 2001, 40, 3071.
(6) Yang, P.; Zhang, D.; Margolese, D.; Chmelka, B.; Stucky, G. Nature 1998, 396, 152.
(7) (a) Vioux, A. Chem. Mater. 1997, 9, 2292; (b) Antonelli, D.; Ying, J. Angew. Chem. Int. Ed. Engl. 1995, 34, 2014.
(8) Ichinose, I.; Senzu, H.; Kunitake, T. Chem. Mater. 1997, 9, 1296.
(9) (a) Kong, J.; Soh, H.; Cassell, A.; Quate, C.; Dai, H. Nature 1998, 395, 878; (b) Yang, P.; Wimsberger, G.; Huang, H.; Cordero, S.; McGehee, M.; Scott, B.; Deng, T.; Whitesides, G.; Chmelka, B.; Buratto, S.; Stucky, G. Science 2000, 287, 465; (c) Lu, Y.; Yang, Y.; Sellinger, A.; Lu, M.; Huang, J.; Fan,H.; Haddad, R.; Lopez, G.; Burns, A.; Sasaki, D.; Shelnutt, J.; Brinker, J. Nature 2001, 410, 913; (d) Fan, H.; Lu, Y.; Stump, A.; Reed, S.; Baer, T.; Schunk, S.; Perez-Lunia, V.; Lopez, G.; Brinker, J. Nature 2000, 405, 56.
(10) Yang, P.; Deng, T.; Zhao, D.; Feng, P.; Pine, D.; Chmelka, B.; Whitesides, G.; Stucky, G. Science 1998, 282, 2244.

What is claimed is:

1. A method of nanolithography comprising:
providing a substrate,
providing a nanoscopic tip having an inking composition thereon, wherein the inking composition comprises at least one metal oxide precursor;
transferring the inking composition from the nanoscopic tip to the substrate to form a deposit on the substrate comprising at least one metal oxide precursor.

2. The method according to claim 1, further comprising the step of inking the nanoscopic tip with the inking composition prior to the transferring step to provide the nanoscopic tip having inking composition thereon.

3. The method according to claim 2, wherein inking the nanoscopic tip with inking composition comprises forming the inking composition and transferring the inking composition to the end of the nanoscopic tip.

4. The method according to claim 1, further comprising the step of converting the metal oxide precursor on the substrate to form the metal oxide.

5. The method according to claim 4, wherein the converting step comprises heating the metal oxide precursor.

6. The method according to claim 5, wherein the inking composition comprises a surfactant and the heating is carried out under conditions which result in the formation of porous metal oxide by volatilization of the surfactant.

7. The method according to claim 1, further comprising the step of inking the nanoscopic tip with the inking composition prior to the transferring step to provide the nanoscopic tip having inking composition thereon; and further comprising the step of converting the metal oxide precursor on the substrate to form the metal oxide.

8. The method according to claim 7, wherein inking the nanoscopic tip with inking composition comprises forming the inking composition and transferring the inking composition to the end of the nanoscopic tip; and wherein the converting step comprises heating the metal oxide precursor.

9. The method according to claim 7, wherein the deposit is a circle which has a diameter of about 200 nm or less and a height of about 50 nm or less, and wherein the nanoscopic tip is an atomic force microscopic tip.

10. The method according to claim 7, wherein the deposit is a line which has a diameter of about 200 nm or less and a height of about 50 nm or less, and wherein the nanoscopic tip is an atomic force microscopic tip.

11. The method according to claim 7, wherein the metal oxide precursor is a metal chloride or a metal alkoxide, and the inking composition further comprises a polymeric surfactant and solvent, and the nanoscopic tip is an atomic force microscopic tip, and:
   (i) wherein the deposit is a circle which has a diameter of about 200 nm or less and a height of about 50 nm or less; or
   (ii) wherein the deposit is a line which has a diameter of about 200 nm or less and a height of about 50 nm or less.

12. The method according to claim 7, wherein the deposit is a circle which has a diameter of about 200 nm or less and at least about 1 nm, and a height of about 50 nm or less, and wherein the nanoscopic tip is an atomic force microscopic tip.

13. The method according to claim 7, wherein the deposit is a line which has a diameter of about 200 nm or less and at least about 1 nm and a height of about 50 nm or less, and wherein the nanoscopic tip is an atomic force microscopic tip.

14. The method according to claim 7, wherein the metal oxide precursor is a metal chloride or a metal alkoxide, and the inking composition further comprises a polymeric surfactant and solvent, and the nanoscopic tip is an atomic force microscopic tip, and:
   (i) wherein the deposit is a circle which has a diameter of about 200 nm or less and at least about 1 nm and a height of about 50 nm or less; or
   (ii) wherein the deposit is a line which has a diameter of about 200 nm or less and at least about 1 nm and a height of about 50 nm or less.

15. The method according to claim 1, wherein the nanoscopic tip is a scanning probe microscopic tip.

16. The method according to claim 1, wherein the nanoscopic tip is an atomic force microscopic tip.

17. The method according to claim 1, wherein the nanoscopic tip is a hollow tip.

18. The method according to claim 1, wherein the inking composition is a sol.

19. The method according to claim 1, wherein the inking composition is a sol-gel precursor.

20. The method according to claim 1, wherein the metal oxide precursor is a hydrolyzable metal oxide precursor.

21. The method according to claim 1, wherein the inking composition further comprises at least one surfactant.

22. The method according to claim 1, wherein the inking composition further comprises at least one amphiphilic polymer.

23. The method according to claim 1, wherein the inking composition comprises at least one surfactant which is a structure-directing agent for the formation of mesoscopic ordered solids.

24. The method according to claim 1, wherein the metal oxide precursor is a metal chloride or a metal alkoxide.

25. The method according to claim 1, wherein the metal oxide precursor is a metal chloride or a metal alkoxide, and the inking composition further comprises a polymeric surfactant and solvent.

26. The method according to claim 1, wherein the deposit is a dot.

27. The method according to claim 1, wherein the deposit is a line.

28. The method according to claim 1, wherein the deposit has as least one lateral dimension which is about 1,000 nm or less.

29. The method according to claim 1, wherein the deposit has at least one lateral dimension which is about 200 nm or less.

30. The method according to claim 1, wherein the deposit has a height of about 50 nm or less.

31. The method according to claim 1, wherein the deposit has a height of about 8 nm or less.

32. The method according to claim 1, wherein the substrate is silicon or silicon oxide.

33. The method according to claim 1, wherein the deposit has as least one lateral dimension which is about 1,000 nm or less and at least about 1 nm.

34. The method according to claim 1, wherein the deposit has at least one lateral dimension which is about 200 nm or less and at least about 1 nm.

35. A method of nanolithography comprising:
   positioning a scanning probe microscopic tip having a reactive ink composition thereon relative to a substrate so that the reactive ink composition is transferred from the nanoscopic tip to the substrate to form a deposit on the substrate, wherein the reactive ink is a sol-gel precursor capable of undergoing a sol-gel reaction.

36. The method according to claim 35, further comprising the step of heating the deposit to substantially complete the sol gel reaction.

37. The method according to claim 35, wherein the tip is an atomic force microscopic tip.

38. The method according to claim 35, wherein the deposit has at least one lateral dimension about 200 nm or less.

39. The method according to claim 35, wherein the reactive ink comprises at least one surfactant.

40. The method according to claim 35, wherein the reactive ink comprises at least one polymeric surfactant.

41. The method according to claim 35, wherein the reactive ink is a sol.

42. The method according to claim 35, wherein the deposit is a dot or line.

43. The method according to claim 35, wherein the tip is an atomic force microscopic tip, wherein the reactive ink is a sol, wherein the deposit has at least one lateral dimension about 200 nm or less, and wherein the reactive ink comprises at least one surfactant.

44. The method according to claim 43, wherein the deposit is a dot or line.

45. The method according to claim 35, wherein the deposit has at least one lateral dimension about 200 nm or less and at least about 1 nm.

46. A method of nanolithography comprising patterning a nanoscopic deposit comprising a solid state material precursor on a substrate, and converting the solid state material precursor to the solid state material.

47. The method according to claim 46, wherein the solid state material is an oxide.

48. The method according to claim 46, wherein the solid state material is a metal oxide.

49. The method according to claim 46, wherein the solid state material is mesoporous.

50. The method according to claim 46, wherein the patterning is carried out with use of a nanoscopic tip.

51. The method according to claim 50, wherein the tip is an atomic force microscopic tip.

52. The method according to claim 46, wherein the nanoscopic deposit has at least one dimension which is less than about 200 nm.

53. The method according to claim 46, wherein the converting is carried out by heating.

54. The method according to claim 46, wherein the solid state material is a metal oxide, wherein the converting is carried out by heating, wherein the solid state material is mesoporous, and wherein the tip is an atomic force microscopic tip.

55. The method according to claim 54, wherein the nanoscopic deposit is a dot or a line and has at least one dimension which is less than about 200 nm.

56. The method according to claim 55, wherein the solid state material precursor is a sol.

57. The method according to claim 56, wherein the nanoscopic deposit is a dot.

58. The method according to claim 56, wherein the substrate is silicon or silicon oxide.

59. The method according to claim 46, wherein the patterning comprises patterning dots with an atomic force microscopic tip, the dots having diameters of about 200 nm or less.

60. The method according to claim 46, wherein the patterning comprises patterning lines with an atomic force microscopic tip, the lines having line widths of about 200 nm or less.

61. The method according to claim 46, wherein the nanoscopic deposit has at least one dimension which is less than about 200 nm and at least about 1 nm.

62. The method according to claim 46, wherein the patterning comprises patterning dots with an atomic force microscopic tip, the dots having diameters of about 200 nm or less and at least about 1 nm.

63. The method according to claim 46, wherein the patterning comprises patterning lines with an atomic force microscopic tip, the lines having line widths of about 200 nm or less and at least about 1 nm.

64. A method of nanolithography comprising:
providing a substrate,
providing a nanoscopic tip having an inking composition thereon, wherein the inking composition comprises at least one metal oxide precursor;
transferring the inking composition from the nanoscopic tip to the substrate to form a deposit on the substrate comprising at least one metal oxide precursor, wherein the transfer occurs via a meniscus.

65. A method of nanolithography comprising:
providing a substrate,
providing a nanoscopic tip having an inking composition thereon, wherein the inking composition comprises at least one metal oxide precursor;
transferring the inking composition from the nanoscopic tip to the substrate to form a deposit on the substrate comprising at least one metal oxide precursor, wherein the transfer occurs under conditions of relative humidity of more than about 40%.

66. A method of nanolithography comprising:
providing a substrate,
providing a nanoscopic tip having an inking composition thereon, wherein the inking composition comprises at least one metal oxide precursor;
transferring the inking composition from the nanoscopic tip to the substrate to form a deposit on the substrate comprising at least one metal oxide precursor, wherein the transfer occurs without a meniscus.

* * * * *